United States Patent
Falck et al.

(10) Patent No.: US 10,038,052 B2
(45) Date of Patent: Jul. 31, 2018

(54) SEMICONDUCTOR DEVICE WITH CHANNELSTOPPER AND METHOD FOR PRODUCING THE SAME

(71) Applicant: Infineon Technologies AG, Neubiberg (DE)

(72) Inventors: Elmar Falck, Hohenbrunn (DE); Frank Dieter Pfirsch, Munich (DE); Hans-Joachim Schulze, Taufkirchen (DE); Stephan Voss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/085,618

(22) Filed: Mar. 30, 2016

(65) Prior Publication Data

US 2016/0293691 A1    Oct. 6, 2016

(30) Foreign Application Priority Data

Mar. 31, 2015 (DE) .................. 10 2015 105 016

(51) Int. Cl.
*H01L 21/761* (2006.01)
*H01L 29/06* (2006.01)
*H01L 29/78* (2006.01)

(52) U.S. Cl.
CPC ........ *H01L 29/0623* (2013.01); *H01L 21/761* (2013.01); *H01L 29/7811* (2013.01); *H01L 29/7813* (2013.01)

(58) Field of Classification Search
CPC .......................... H01L 29/0623; H01L 21/761
See application file for complete search history.

(56) References Cited

U.S. PATENT DOCUMENTS

| 5,597,765 A | * | 1/1997 | Yilmaz | ................. H01L 29/402 257/E29.201 |
| --- | --- | --- | --- | --- |
| 7,911,021 B2 | | 3/2011 | Paul | |
| 2006/0060916 A1 | | 3/2006 | Girdhar et al. | |
| 2011/0233714 A1 | * | 9/2011 | Lu | ..................... H01L 29/66348 257/493 |
| 2014/0179079 A1 | * | 6/2014 | Huang | ............. H01L 29/66681 438/286 |
| 2014/0264567 A1 | | 9/2014 | Challa | |

FOREIGN PATENT DOCUMENTS

JP          2008103530 A          1/2008

OTHER PUBLICATIONS

Office Action communication of the German Patent and Trademark Office for Appln. Ser. No. 102015105016.1, Apr. 2, 2015.

\* cited by examiner

*Primary Examiner* — Marc Armand
(74) *Attorney, Agent, or Firm* — Slater Matsil, LLP

(57) ABSTRACT

A vertical semiconductor device comprises a substrate having a front surface and a back surface, an active area (AA) located in the substrate, having a drift region doped with a first dopant type, an edge termination region (ER) laterally surrounding the active area (AA), a channelstopper terminal provided at the front surface and located in the edge termination region (ER), and a first suppression trench located on a side of the channelstopper terminal towards the active region (AA), and provided adjacent to the channelstopper terminal. Further, a production method for such a semiconductor device is provided.

23 Claims, 5 Drawing Sheets

SEMICONDUCTOR DEVICE WITH CHANNELSTOPPER AND METHOD FOR PRODUCING THE SAME

CROSS-REFERENCE TO RELATED APPLICATION

This application claims priority to German Application Serial No. 102015105016.1 filed Mar. 31, 2015 and entitled "Semiconductor Device With Channelstopper and Method for Producing the Same".

FIELD OF THE INVENTION

This disclosure relates to embodiments of a semiconductor device having a channelstopper, and particularly to embodiments of unipolar and bipolar power semiconductor devices, such as field effect transistors (FET) and insulated gate bipolar transistors (IGBT), as well as integrated circuits, having a channelstopper.

TECHNICAL BACKGROUND

In Power FET devices, channelstoppers are used to suppress a potential buildup of a parasitic inversion channel in an edge region of the chip. A channelstopper typically comprises a doped area close to the edge region of a chip, which is henceforth called channelstopper terminal. The latter is electrically connected to the backside, or drain, potential of the device. On the surface adjacent to the channelstopper terminal, there is typically provided a field plate comprising a metal, such as aluminium, or another conducting material, which is part of the channelstopper.

It was found experimentally that under certain operating conditions, particularly in the case of a low base doping in the surface-near area of a semiconductor surface, the space-charge region of the device may extend in a lateral direction to reach the region of the channelstopper terminal. This can lead to an injection of minority charge carriers (bipolar injection), and thus to an undesirable increase of a leakage current, especially in the case of p-doped channelstopper terminals. Typically, p-doped channelstoppers are used to simplify the production process of power devices. This undesirable behaviour occurs particularly at high operating temperatures, when the drain-connected channelstopper terminal functions as an effective parasitic transistor. In cases of a very low doping in the surface area, especially in conjunction with vertically varying doping profiles, such as resulting from a doping with protons, negative charges in a concentration range as low as about $10^{11}$ cm$^{-2}$ have shown to be harmful in the described respect. There is no known way to effectively suppress this parasitic effect in conjunction with a p-type channel stopper.

Therefore, it is desirable to have a semiconductor device and a production method therefore, which avoids the above-mentioned problems.

SUMMARY OF THE INVENTION

According to an embodiment, a vertical semiconductor device is provided. It comprises a substrate having a front surface, an active area located in the substrate, having a drift region doped with a first dopant type, an edge termination region laterally surrounding the active area, and a channelstopper terminal provided on the front surface, located in the edge termination region. A first suppression trench is located on a side of the channelstopper terminal towards the active region and provided adjacent to the channelstopper terminal.

According to a further embodiment, a method for producing a vertical semiconductor device is provided. The method comprises: providing a substrate of a first dopant type, having a front surface, providing, in the substrate, an active area and an edge termination region laterally surrounding the active area, providing a channelstopper terminal on the front surface in the edge termination region, and providing a first suppression trench in an area between the active area and the channelstopper terminal.

Further embodiments, modifications and improvements of the semiconductor device and the method will become more apparent from the following description and the appending claims.

BRIEF DESCRIPTION OF THE FIGURES

A full and enabling disclosure, including the best mode thereof, to one of ordinary skill in the art, is set forth more particularly in the remainder of the specification, including reference to the accompanying figures. Therein.

DETAILED DESCRIPTION

Figure 1:
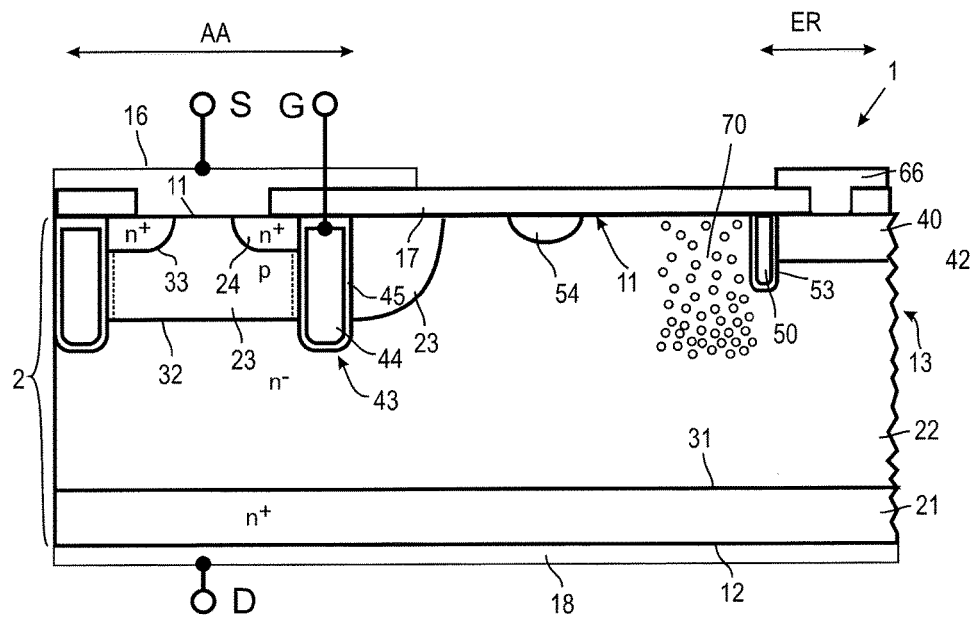
FIG. 1 shows a semiconductor device according to an embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical" etc., is used with reference to the orientation of the Figure(s) being described. These terms are intended to encompass different orientations of the device in addition to different orientations than those depicted in the figures. Because components of embodiments can be positioned in a number of different orientations, the directional terminology is used for purpose of illustration and is in no way limiting. Further, terms such as "first", "second", and the like, are also used to describe various elements, regions, sections, etc. and are also not intended to be limiting. Like terms refer to like elements throughout the description. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The threshold voltage, commonly abbreviated as $V_{th}$, of a field-effect transistor (FET) is the value of the gate-source voltage at which the conductive properties of the FET significantly changes, either from non-conductive to conductive in case of enhancement devices of from conductive to non-conductive with increasing gate-source voltage in case of depletion devices. The threshold voltage is also referred to as pinch-off voltage. For enhancement devices, an inversion channel is formed in the channel region of the body region next to the dielectric region or dielectric layer when the voltage between the gate electrode and the source region is above the threshold voltage $V_{th}$. At the threshold voltage, the channel region formed in the body region begins to establish an ohmic connection between the source and drain contacts of the transistor. Below this threshold voltage, the FET is non-conductive. Thus, the threshold voltage Vth often refers to the minimum gate voltage necessary for the onset of a unipolar current flow between the two semiconductor regions of the first conductivity type, which form the source and the drift or drain of a transistor structure.

In this specification, a back surface of a semiconductor substrate is considered to be formed by the lower or backside surface while a front surface is considered to be formed by the upper, front or main surface of the semiconductor substrate. The terms "above" and "below" as used in this specification therefore describe a relative location of a structural feature to another structural feature with consideration of this orientation.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to also include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include electrically conductive materials such as, but not restricted to, metal, alloys, doped polycrystalline semiconductors and metal semiconductor compounds such as metal silicides.

Field-effect controlled switching devices such as Metal Oxide Semiconductor Field-effect Transistors (MOSFETs) or Insulated Gate Bipolar Transistors (IGBTs) have been used for various applications, including use as switches in power supplies and power converters, electric cars, air-conditioners, and even stereo systems. Particularly with regard to power devices capable of switching large currents and/or operating at higher voltages, a low resistance in the conducting on-state is often desired. This means e.g. that, for a given current to be switched, the voltage drop across the switched on FET, e.g., the source-drain voltage is desired to be low. On the other hand, the losses occurring during switching off or commutating of the FET are often also to be kept small to minimize the overall losses.

The term "semiconductor power switch" as used in this specification intends to describe a semiconductor device on a single chip with high voltage and/or high current switching capabilities. In other words, power semiconductor devices are intended for high current, typically in the Ampere range. Within this specification the terms "semiconductor power switch", "semiconductor switching device", and "power semiconductor device" are used synonymously.

In the context of the present specification, the term "active cell region" or "active area" intends to describe a region of a semiconductor substrate of the semiconductor switching device where switchable cells which carry the load current are arranged. The switchable cells in the active area define the switching behavior of the semiconductor switching device. Specifically, an active area can include at least a main or first switchable region and a second switchable region, optionally more than two different switchable regions. Switchable cells in different switchable regions can differ from each other in at least one physical property such as the gate-drain capacitance or the threshold voltage. The different switchable regions of the active area are also referred to as "sub-regions" of the active area and describe regions having switchable cells, or portions of switchable cells, with physical properties which are different to the physical properties of switchable cells of other sub-regions. In particular, different sub-regions can be manufactured with different threshold voltages such that the threshold voltage of an individual cell or a group of individual cells of a specific sub-region is different to the threshold voltage of an individual cell or a group of individual cells of another specific sub-region.

In the context of the present specification, the term "cell pitch" or "longitudinal pitch" intends to describe the pitch of the switchable cells in the active area.

In the context of the present specification, the term "gate electrode structure" intends to describe a conductive structure which is arranged next to, and insulated from the semiconductor substrate by a dielectric region or dielectric layer. The gate electrode structure covers, when seen onto the surface of the semiconductor substrate, different regions of the semiconductor device such as body regions and drift regions. The gate electrode structure includes the gate electrodes of the switchable cells next to the body regions and also electrical connections between adjacent gate electrodes which are electrically connected with each other. The gate electrodes are configured to form and/or control the conductivity of a channel region in the body region, for example by the electric-field-mediated formation of an "inversion channel" in the body regions between the respective source regions and drift regions of the switchable cells. When forming an inversion channel, the conductivity type of the channel region is typically changed, i.e., inverted, to form an unipolar current path between the source and the drain region. The gate electrode structure is often conveniently referred to as gate polysilicon.

Examples of dielectric materials for forming a dielectric region or dielectric layer between the gate electrode and the body region include, without being limited thereto, silicon oxide ($SiO_2$), silicon nitride ($Si_3N_4$), silicon oxinitride ($Si_xO_yN_y$), zirconium oxide ($ZrO_2$), tantalum oxide ($Ta_2O_5$), titanium oxide ($TiO_2$) and hafnium oxide ($HfO_2$), and combinations thereof including stacks of different insulating materials.

The terms "electrical connection" and "electrically connected" describes an ohmic connection between two elements.

In the context of the present specification, the term "gate signal emitter" intends to describe an electrode configuration which provides transfer of external switching signals to the gate electrode structure of the switchable cells. Within this specification the terms "gate metallization" and "gate signal emitter" are used synonymously. Typically, the gate metallization is formed on the gate electrode structure to improve distribution of the switching signal. For example, the gate electrode structure is formed by polysilicon and can have a net-like structure covering the active area while the gate metallization is formed on and in ohmic contact with the gate electrode structure in the periphery of the semiconductor device, for example, in the edge termination area. The gate metallization can include, for example, a gate ring, or a gate ring and gate fingers extending from the gate ring into the active area. The net-like structure of the gate electrode structure includes openings for source plugs or source contacts. Gate signal emitters typically have a lower specific resistance than the gate electrode structure. For example, gate signal emitters can be made of a more conductive material than the gate electrode structure and/or can be made thicker than the gate electrode structure to reduce the resistance.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

In the context of the present specification, the term "channelstopper" is intended to mean the combination of a doped area in the semiconductor substrate, called channelstopper terminal, located in an edge region of the device, which is connected to a field plate on the surface of the substrate, which is located adjacent to the channelstopper terminal. The channelstopper terminal is electrically connected to a drain potential (or backside potential) of the semiconductor device typically via the chip edge (sawing edge). Thereby, the electrical connection between the channelstopper terminal and the field plate of the channelstopper is typically realized in the corner regions of the chip via a contact structure.

Generally, embodiments relate to vertical semiconductor devices which have an active area located in a semiconductor substrate and a drift region doped with a first dopant type. An edge termination region laterally surrounds the active area, and a channelstopper terminal is provided at a front surface of the substrate in the edge termination region. A first suppression trench is provided on a side of the channelstopper terminal towards the active region, the trench surrounding the active area laterally. The first suppression trench serves for suppressing a bipolar injection in the region of the channelstopper terminal. The first suppression trench is electrically isolated from the channelstopper terminal. It is adjacent to the channelstopper terminal, and may abut it or be distanced from it in a direction towards the active region. Typically, the channelstopper terminal is electrically connected via the chip edge to a drain potential on the backside of the semiconductor substrate. In typical embodiments which are described in the following, the drift zone is n-doped and the channelstopper terminal is p-doped, but in embodiments the drift zone may also be p-doped and the channelstopper terminal n-doped.

Generally, in embodiments it is proposed to provide an additional trench, henceforth called suppression trench, between the channelstopper terminal and the active area in the semiconductor body. The suppression trench leads to an effective suppression of a bipolar injection during operation in the vicinity of a p-doped channelstopper terminal.

Preferably, this suppression trench is positioned as close as possible to the p-type channelstopper terminal. If the device to be optimized is, for example, a trench IGBT, the process for the gate trench can be used with no additional process effort and expense, requiring only a design change. Typical suppression trench depths are for example 3 to 5 micrometers, wherein the trench width may be for example up to a few micrometers. The trench may be preferably lined with doped or undoped oxide, or may be completely filled with it, when the width of the trench is not too wide. In embodiments, the filling of the trench with other insulators, such as high-k materials, is also possible.

With reference to FIG. 1, a first embodiment of a semiconductor device 1 is described, wherein the device is exemplarily a MOSFET. The semiconductor device 1 includes a semiconductor substrate 2 having a front surface 11 and a back surface 12 arranged opposite to the front surface 11. The semiconductor substrate or body 2 can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, SiC and SiGe heterojunction semiconductor material. For power semiconductor applications currently mainly Si, SiC and GaN materials are used.

The semiconductor substrate 2 can be a single bulk mono-crystalline material. It is also possible, that the semiconductor substrate 2 includes a bulk mono-crystalline material and at least one epitaxial layer formed thereon. Using epitaxial layers provides more freedom in tailoring the background doping of the material since the doping concentration can be adjusted during deposition of the epitaxial layer or layers.

The semiconductor substrate 2 further includes a drift region 22 of the first conductivity type. Drift region 22 is a weakly n-doped region. In contact with drift region 22, a drain region 21 is arranged as a contact region, on which drain electrode 18 is provided. In this embodiment, drain region 21 is highly n-doped and forms a first junction 31, that is to say an nn+ junction in this embodiment, with n−doped drift region 22. In other embodiments, a field stop region (not shown in FIG. 1) of the first conductivity type, having a higher doping concentration than the drift region 22 and a lower doping concentration than the drain region 21, is formed between the drift region 22 and the drain region 21. In some embodiments, the drift region 22 can have a doping concentration in a range from about $10^{13}/cm^3$ to about $10^{17}/cm^3$. In further embodiments, the drain region 21 can have a doping concentration in a range from about $10^{18}/cm^3$ to about $10^{21}/cm^3$.

A p-doped body region 23 is formed on and in contact with the drift region 22. Thereby a second junction 32, that is to say a pn-junction in this embodiment, is formed. In some embodiments, the body region 23 can have a typical doping concentration in a range from about $10^{15}/cm^3$ to about $10^{19}/cm^3$. As shown in FIG. 1, at least one highly n-doped source region 24 is embedded in the body region 23. In some embodiments, source region or regions 24 can have a doping concentration in a range from about $10^{17}/cm^3$ to about $10^{20}/cm^3$. A third junction 33, that is to say a pn-junction in this embodiment, is formed between the source regions 24 and the body region 23.

Isolation layer 17 can be made of, for example, oxides or other insulating materials. For example, Isolation layer 17 can be thermally grown on the front surface 11 of the semiconductor substrate 2 either selectively or globally. In the latter case, the thus formed oxide layer is subsequently structured. The electrical contact between gate electrode 44 and gate contact G is only schematically shown, it may for example be realized in a plane which is behind or in front of the drawing plane.

At least one channelstopper terminal 40 is arranged in the semiconductor substrate 2 in the edge termination region ER. The channelstopper terminal 40 extends from the front surface 11 substantially vertically in the semiconductor substrate 2. A skilled person will appreciate that the edge termination region ER typically completely surrounds the active area AA, or a plurality of active areas, when seen in a plan view on the front surface 11 of the semiconductor substrate 2.

Substrate edge 13 is typically formed by sawing, laser cutting or any other suitable separating process during a separation process to separate semiconductor device 1 from other devices, which were commonly processed with semiconductor device 1 on a common wafer substrate. Substrate edge 13 therefore may exhibit crystal defects caused by the separation process as well as dangling bonds.

In high voltage devices, the channelstopper 40 prevents the build-up of an inversion channel in the edge region.

In embodiments, the channelstopper terminal 40 is connected to the potential of drain 18 via the substrate edge 13. Further, the semiconductor substrate may include at least one field ring 54, which is optionally in ohmic connection with at least one field plate 56 (not shown in FIG. 1, see e.g. FIG. 3 and FIG. 4) located on the surface 11 of the substrate. The field plate 56 typically comprises a conductive material, such as doped polysilicon, or aluminium. There may be provided a plurality of field rings 54 and optional field plates 56 provided between the active region AA and the channelstopper terminal 40. The particular arrangement of the one or more field rings and field plates, and of the channel stopper terminal 40, can be selected according to specific needs. Alternatively to the field ring structure described, the edge termination may also be based on the well-known variation of lateral doping (VLD, not shown) or junction termination extension (JTE).

In embodiments, there is provided an additional suppression trench 50 between the channelstopper terminal 40 and the active area AA in the semiconductor body. The suppression trench 50 leads to an effective suppression of bipolar injection in cases when a space charge zone extends to the channelstopper terminal due to a high inverse voltage. Preferably, this suppression trench 50 is positioned close to the p-type channelstopper terminal 40.

Typical depths of the suppression trench are, as non-limiting examples, 2 to 7 µm. The width of the suppression trench 50 may be, for example, up to a few µm, such as 0.5 to 3 µm. The walls of the first suppression trench 50 may be covered with a thin layer 53 which comprises, for example, silicon oxide, or doped silicon oxide. The first suppression trench 50 comprises at least one of polysilicon, silicon oxide, a high-k-material, or phosphorus silicate glass.

The complete filling of the suppression trench with undoped silicon oxide, while omitting a lining, is typically only feasible when the width of the trench is not too wide. In embodiments, the filling of the trench with other insulators, such as high-k materials, is also possible, whereby the suppression trench 50 is typically filled with the same material as employed for the trenches in the active area AA.

The provision of a first suppression trench 50 as described above is particularly suitable in conjunction with a very low base doping of the semiconductor substrate 2 in the area near surface 11, which can lead, as was previously described, to increased leakage currents especially in the case of a p-doped channelstopper terminal 40, and to a bipolar injection of minority charge carriers. Such a situation can occur, for example, if the drift region 22 has a vertically inhomogeneous doping profile 70, which is exemplarily shown in FIG. 1. Thereby, the drift zone 22 has a doping profile 70 with a lower doping towards the front surface 11 of the semiconductor substrate 2, which may for example be the result of an ion implantation, for example a proton implantation, via semiconductor surface 11.

Typically, a field plate 66 is provided on the semiconductor front surface 11 in the region of the p-type channelstopper terminal 40. The field plate 66 is connected via contacts 49, typically provided in corners of the chip (not shown in FIG. 1, see for example FIG. 5) to the channelstopper terminal 40, which is connected to the potential of drain 18 via the substrate edge 13.

Figure 2:
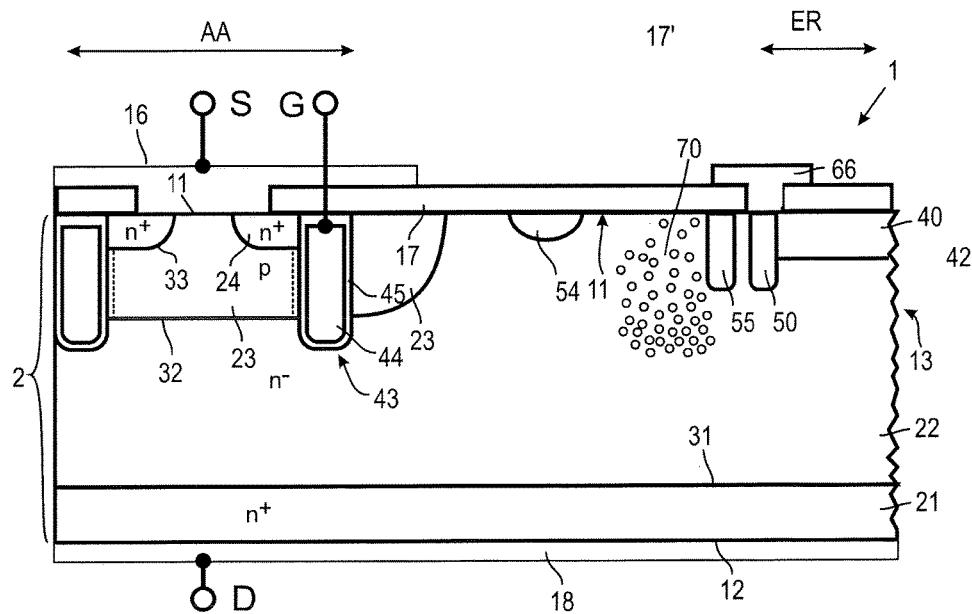
FIG. 2 shows a semiconductor device according to another embodiment.

According to embodiments as shown in FIG. 2, a further suppression trench 55 is provided between the channelstopper 40 and the active area AA. It is provided on a side of the first suppression trench 50 towards the active region AA. The further suppression trench 55 is typically similar to the first suppression trench 50, thus having the same dimensions as the first suppression trench 50. Optionally, even three or more suppression trenches may be provided on a side of the channelstopper 40 towards the active area AA. Each further suppression trench may serve to suppress the injection of minority carriers. The individual placing of the suppression trenches, as well as their dimensions, may be readily chosen via simulation and optimization. Optionally, field plate(s) may be provided in the suppression trench(es), for example comprising polysilicon.

Figure 3:
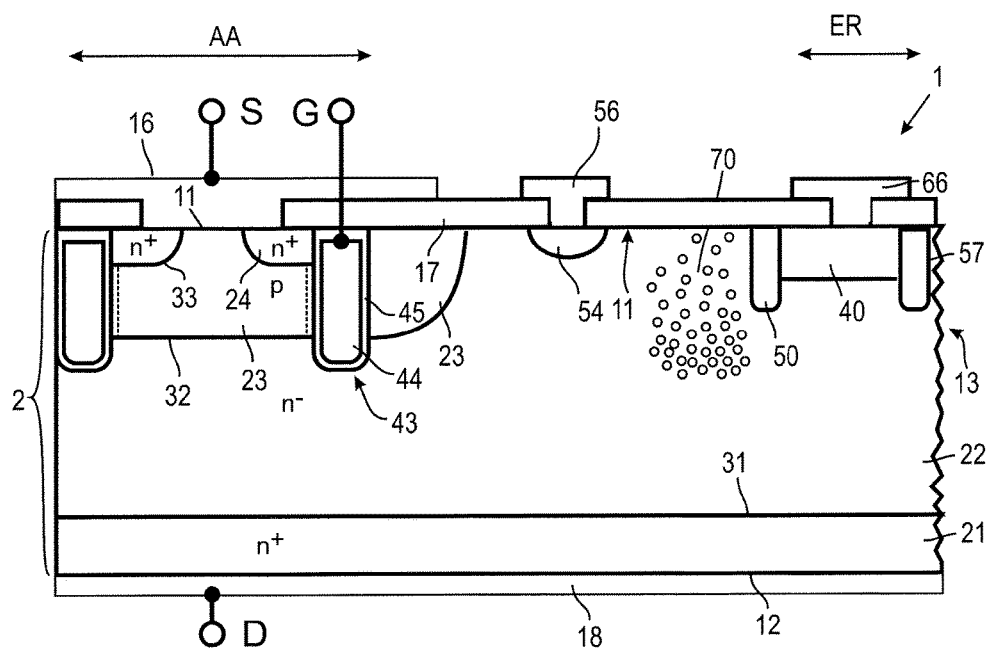
FIG. 3 shows a semiconductor device according to a further embodiment.

According to embodiments as shown in FIG. 3, a further, outer suppression trench 57 is provided between the channelstopper 40 and a substrate edge 13 of the substrate 2. That is, the outer suppression trench 57 is provided on a side of the channelstopper terminal 40 directed away from the active area AA. It is, like first suppression trench 50, positioned in the vicinity, typically adjacent to, the channelstopper terminal 40.

Optionally, an n-blanket implantation may be carried out in the area of the channel stopper 40, over the entire edge termination region or over the entire front surface of the semiconductor 1. The implantation dose for this n-blanket implantation is typically in the range between $1 \times 10^{11}$ cm$^{-2}$ and $5 \times 10^{11}$ cm$^{-2}$, or more typically, between $1.5 \times 10^{11}$ cm$^{-2}$ and $3 \times 10^{11}$ cm$^{-2}$. The penetration depth of this n-blanket layer after the annealing process performed subsequent to the implantation is typically less than 5 µm, or even less than 3 µm, or more typically even less than 1 µm.

The first suppression trench 50, located between the channelstopper terminal 40 and the active region AA, may optionally be provided with an increased n-doping. This can be carried out via an implantation and/or a diffusion of a donor material, in order to suppress a bipolar injection in the region of the channelstopper terminal 40. In this manner, the first suppression trench 50 may serve as a kind of additional n-doped channelstopper terminal. If this trench is suitably positioned, the p-doped channelstopper terminal 40 may even be omitted and replaced by the n-doped first suppression trench 50. The same may be applied for the outer suppression trench 57 and particularly for the further suppression trench 55 located inwards from the first suppression trench 50 with respect to the active region AA.

The filling of the first suppression trench 50 may be provided with a heavy doping with the first dopant type. This may typically be carried out by employing a locally deposited phosphorus silicate glass filling of the first suppression trench 50. Thereby, P atoms may diffuse into the neighboring semiconductor substrate 2 around the first suppression trench 50 and create an n-doped zone shielding the p-doped channelstopper terminal 40. This bears the advantage that there are typically no additional process steps required, as phosphorus silicate glass (PSG) or boron-phosphorus silicate glass (BPSG) deposition steps are employed during the production of the semiconductor device 1 anyway. Typically, only the respective mask has to be adapted, leading to a modification of the insulating layers.

It is in embodiments also possible to employ further high temperature processes for diffusing the P dopant out of the first suppression trench 50 into the surrounding semiconductor substrate.

During the above deposition employing PSG, a thin oxide layer may be employed between the PSG layer and the front surface 11, the thickness of which has to be provided sufficiently low so that P atoms from the PSG may diffuse through them. For the same purpose, also BPSG may be employed, as the P content in this material is typically significantly higher, such as about a factor of two, in comparison to the B content. The thin oxide layer may be advantageous in that case, as the diffusion coefficient of P in silicon oxide is significantly higher than that of B, hence the P atoms reach the boundary between the thin oxide layer and the front surface 11 of the semiconductor substrate significantly faster than B atoms.

Figure 4:
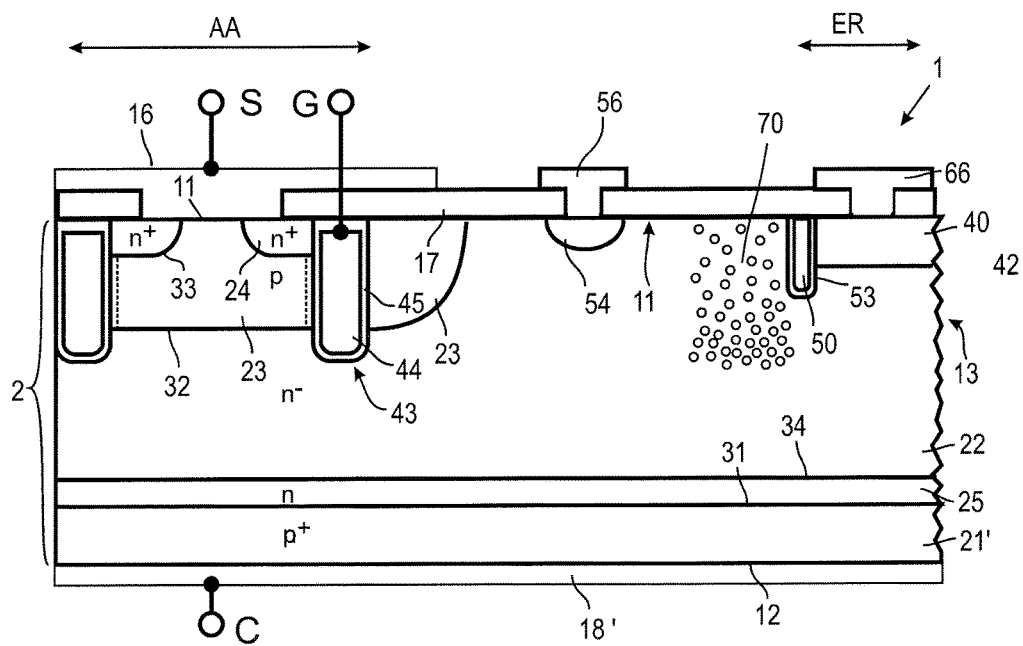
FIG. 4 shows a semiconductor device according to a further embodiment.

While the embodiments of FIGS. 1, 2 and 3 pertain to unipolar power semiconductor devices such as power FETs, the embodiment of FIG. 4 pertains to a bipolar power semiconductor device, particularly to IGBTs and diodes. Therefore, an emitter region 21' of the second conductivity type, in this case a highly p-doped region, is formed at the second surface 12. The first junction 31 is formed here between the emitter region 21' and an optional field stop region 25 of the first conductivity type having a doping concentration higher than the doping concentration of the drift region 22. A fourth junction 34, in this case an nn⁻ junction, is formed between field stop region 25 and drift region 22. Emitter region 21' is electrically contacted by the second metallization 18, which includes a collector terminal C.

Figure 5:
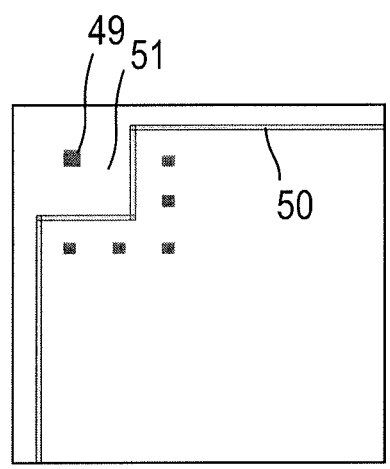
FIG. 5 shows, in a plan view, a partial layout view on a semiconductor device according to embodiments.

In FIG. 5, a top view on the layout of the area of channelstopper terminal 40 in a corner of a chip is shown. Via the contact 49 the channelstopper terminal 40 is connected to a field plate 66 (not shown).

Figure 6:
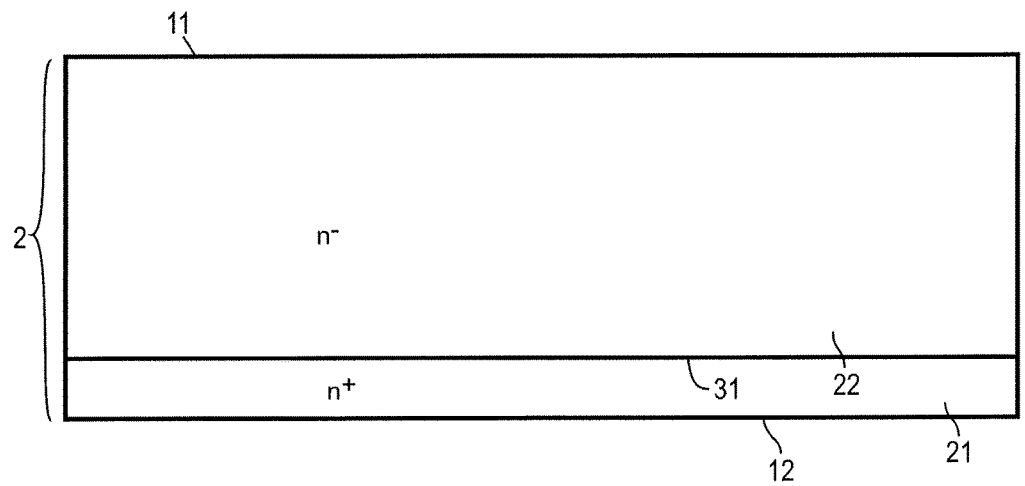
FIG. 6 to FIG. 8 show various states in the production of a semiconductor device according to embodiments.
Figure 7:
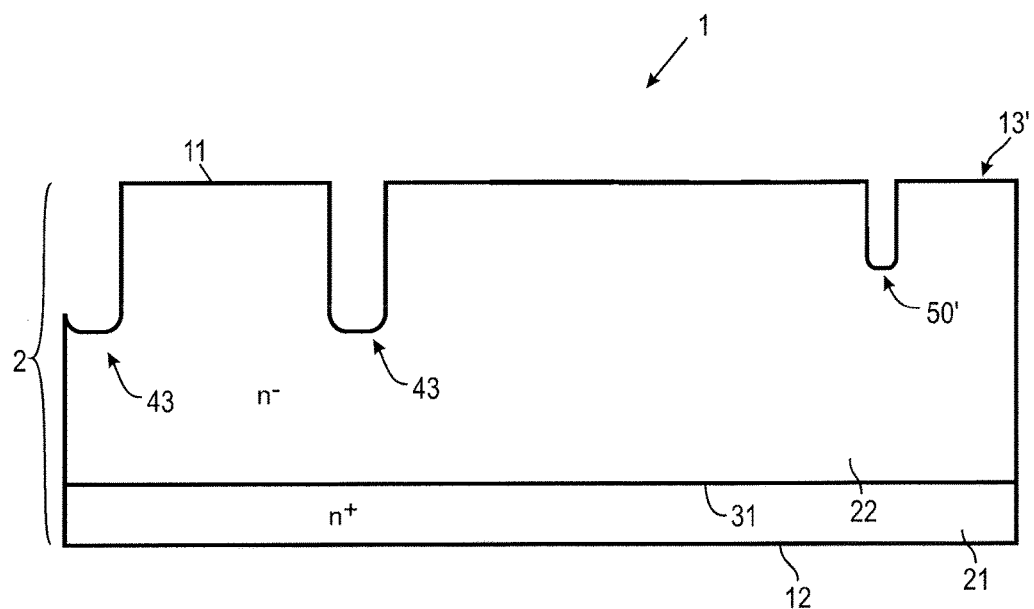

In FIG. 6, a semiconductor substrate 2 is shown after provision of the drain region 21, which is part of a production process of a MOSFET semiconductor device. In FIG. 7, the status of the semiconductor substrate 2 after etching the gate trenches 43, and the trench 50' for the later suppression trench 50 is shown. The trench 50' for first suppression trench 50 is typically, but not necessarily produced in the same production step as a gate trench 43 of the active area AA.

Figure 8:
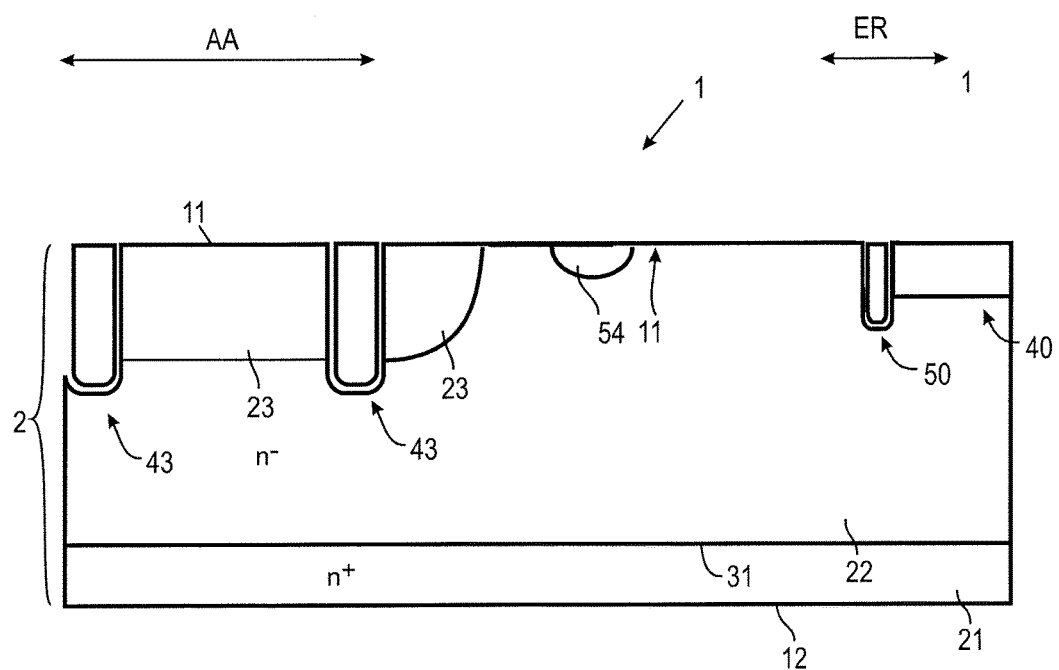

Prior to the status shown in FIG. 8, a mask (not shown) used for controlling a deposition of polysilicon in the gate trenches 43 of the active region AA active region is also used for controlling the filling of the first suppression trench 50. After, or partly simultaneous to the filling of the suppression trench 50 and the provision of channelstopper terminal 40 and the body region 23, typically by depositing a dopant, the substrate 2 is further processed as known in the art to arrive at a semiconductor device as described with respect to FIG. 1 or, with a modified process, with respect to FIG. 4, for example. Thereby, for example, one or more oxide layers 17 are provided and contacts G and S for the gate and source are provided.

With the embodiments described herein, leakage currents in power semiconductor devices, along with an undesirable bipolar injection in the region of the channelstopper terminal, can be significantly reduced. Acquired effects comprise an improved trade-off between required edge region dimensioning, chip thickness and blocking capability. A further effect is an improved durability of the respective electronic components, which are thus also more economical.

The written description above includes specific embodiments, including the best mode thereof, and also to enable any person skilled in the art to make and use the invention. While the invention has been described in terms of various specific embodiments, those skilled in the art will recognise that the invention can be practiced with modifications within the spirit and scope of the claims. Especially, mutually non-exclusive features of the embodiments described above may be combined with each other. The patentable scope is defined by the claims, and includes other examples that occur to those skilled in the art. Such other examples are intended to be within the scope of the claims.

The invention claimed is:

1. A vertical semiconductor device comprising:
   a substrate having a front surface and a back surface,
   an active area located in the substrate;
   an edge termination region laterally surrounding the active area,
   a drift region extending from within the active area to within the edge termination region, the drift region doped with a first dopant type;
   a body region located in the active area on and in contact with the drift region, and doped with a second dopant type opposite the first dopant type;
   a channelstopper terminal provided on the front surface and located in the edge termination region, wherein the channelstopper terminal is doped with the second dopant type, and is separated from the body region by the drift region; and
   a first suppression trench located on a side of the channelstopper terminal towards the active area, wherein a first side of the first suppression trench facing the active area is in contact with the drift region, and a second side of the first suppression trench opposite the active area is in contact with the channelstopper terminal.

2. The vertical semiconductor device of claim 1, wherein the drift region has a vertically inhomogeneous doping profile with a lower doping towards the front surface of the substrate.

3. The vertical semiconductor device of claim 1, wherein a depth of the first suppression trench is from about 2 to about 7 μm, and a width of the first suppression trench is from about 0.5 to about 3 μm.

4. The vertical semiconductor device of claim 1, wherein walls of the first suppression trench are covered with a layer comprising at least one of: silicon oxide, and doped silicon oxide, and wherein the first suppression trench comprises at least one of:
- polysilicon,
- silicon oxide,
- a high-k-material, and
- phosphorus silicate glass.

5. The vertical semiconductor device of claim 1, wherein
- the first dopant type is an n-dopant, and the second dopant type is a p-dopant, or
- the first dopant type is a p-dopant, and the second dopant type is an n-dopant.

6. The vertical semiconductor device of claim 1, wherein the device is one of a diode, an IGBT, and a Power MOSFET.

7. The vertical semiconductor device of claim 1, further comprising an outer suppression trench provided between the channelstopper terminal and a substrate edge of the substrate.

8. The vertical semiconductor device of claim 1, wherein the first suppression trench has a filling comprising phosphorus silicate glass.

9. The vertical semiconductor device of claim 1, and further comprising a field stop region disposed below the drift region.

10. The vertical semiconductor device of claim 1, wherein, the channelstopper terminal has p-type doping.

11. The vertical semiconductor device of claim 1, further comprising a drain region in contact with the drift region, wherein the drain region is doped with the first dopant type, the drain region is separated from the body region by the drift region, and the drain region is electrically connected to the channelstopper terminal via an ohmic contact to the channelstopper terminal.

12. The vertical semiconductor device of claim 1, wherein the drift region has a vertically inhomogeneous doping profile.

13. The vertical semiconductor device of claim 12, wherein the vertically inhomogeneous doping profile is formed by ion implantation.

14. The vertical semiconductor device of claim 1, wherein walls of the first suppression trench are covered with a dielectric layer.

15. A method for producing a vertical semiconductor device, comprising:
- providing a substrate having a front surface and a back surface,
- providing an active area located in the substrate,
- providing an edge termination region laterally surrounding the active area,
- providing a drift region extending from within the active area to within the edge termination region, the drift region doped with a first dopant type;
- providing a body region located in the active area on and in contact with the drift region, and doped with a second dopant type opposite the first dopant type;
- providing a channelstopper terminal provided on the front surface and located in the edge termination region, wherein the channelstopper terminal is doped with the second dopant type, and is separated from the body region by the drift region; and
- providing a first suppression trench located on a side of the channelstopper terminal towards the active area, wherein a first side of the first suppression trench facing the active area is in contact with the drift region, and a second side of the first suppression trench opposite the active area is in contact with the channelstopper terminal.

16. The method of claim 15, wherein the substrate has a vertically inhomogeneous doping profile, preferably with a lower doping towards the front surface of the substrate.

17. The method of claim 16, wherein the vertically inhomogeneous doping profile is achieved by an implantation of protons.

18. The method of claim 15, further comprising: covering walls of the first suppression trench with at least one of: a layer of silicon oxide, and a thin layer of doped silicon oxide, and filling the first suppression trench with at least one of:
- polysilicon, and
- silicon oxide, and
- a high-k-material, and
- phosphorus silicate glass.

19. The method of claim 15, wherein a filling of the first suppression trench is heavily doped with a dopant the first dopant type, by employing a phosphorus silicate glass filling of the first suppression trench.

20. The method of claim 15, wherein the first suppression trench is produced in the same production step as a gate trench of the active area.

21. The method of claim 15, wherein a further suppression trench is provided between the channelstopper terminal and the active area.

22. The method of claim 15, wherein an outer suppression trench is provided between the channelstopper terminal and a substrate edge of the substrate, which is heavily doped with a first dopant of the first dopant type, and which is doped by at least one of: diffusion, implantation, preferably by diffusion of P atoms from phosphorus silicate glass.

23. The method of claim 15, wherein the doping of the first suppression trench and/or the further suppression trench is produced by diffusing or implanting a dopant into the region of the respective trench and optionally into adjacent areas.

* * * * *